United States Patent
Ou-yang et al.

(10) Patent No.: US 7,382,153 B2
(45) Date of Patent: Jun. 3, 2008

(54) ON-CHIP RESISTOR CALIBRATION FOR LINE TERMINATION

(75) Inventors: Quing Ou-yang, Shanghai (CN); Quan Yu, Shanghai (CN); Ming Qu, San Jose, CA (US)

(73) Assignee: Parade Technologies, Ltd., George Town, Grand Cayman (KY)

( * ) Notice: Subject to any disclaimer, the term of this patent is extended or adjusted under 35 U.S.C. 154(b) by 21 days.

(21) Appl. No.: 11/459,880

(22) Filed: Jul. 25, 2006

(65) Prior Publication Data
US 2008/0024160 A1    Jan. 31, 2008

(51) Int. Cl.
*H03K 17/16* (2006.01)

(52) U.S. Cl. ............... 326/30; 326/86; 327/108; 341/121

(58) Field of Classification Search ........... 326/21, 326/30, 81–83, 86–87; 327/108
See application file for complete search history.

(56) References Cited

U.S. PATENT DOCUMENTS

| | | | |
|---|---|---|---|
| 6,570,402 B2 * | 5/2003 | Koo et al. | 326/30 |
| 7,081,842 B2 * | 7/2006 | Cranford et al. | 341/121 |
| 7,142,007 B2 * | 11/2006 | Baecher et al. | 326/30 |
| 7,268,712 B1 * | 9/2007 | Sheen | 341/120 |
| 2004/0090239 A1 * | 5/2004 | Ikeoku et al. | 326/30 |

OTHER PUBLICATIONS

Fan, et.al., "On-Die Termination Resistors with Analog Impedance Control for Standard CMOS Technology", IEEE Journal of Solid State Circuits, vol. 38, No. 2, Feb. 2003.

Ooishi, et.al., "A Mixed-Mode Voltage Down Converter with Impedance Adjustment Circuitry . . . ", IEEE Journal of Solid State Circuits, vol. 31, No. 4, Apr. 1996.

* cited by examiner

*Primary Examiner*—Rexford Barnie
*Assistant Examiner*—Christopher Lo
(74) *Attorney, Agent, or Firm*—Fenwick & West LLP

(57) ABSTRACT

A circuit for calibrating a resistance value on an integrated circuit includes a resistor network, a reference voltage generator, a comparator, a servo loop, and a shift register. The resistor network includes a plurality of resistor and switch pairs in parallel. The resistor network further includes a servo resistor in series with a servo resistor switch such that the servo resistor and servo resistor switch are in parallel with the plurality of resistor and switch pairs. The servo loop generates a shift register gating signal and includes a current sample register for storing a current comparator output data value and a previous sample register for storing a previous comparator output data value. The shift register, upon receipt of a shift register gating signal at a first state, inputs the current comparator output data value to shift data bits through the shift register.

24 Claims, 2 Drawing Sheets

ON-CHIP RESISTOR CALIBRATION FOR LINE TERMINATION

BACKGROUND OF THE INVENTION

Line termination in high speed signaling applications is an important electrical performance requirement for high quality signal transfer. Directly related, signal quality and return loss are important performance parameters which are a function of the line termination. On-chip resistors are used as line terminations for the signal transfer. The accuracy of on-chip resistors is therefore important. Many applications require accurate line termination resistors within a range of −10% to 10%. Such applications include, for example, DVI, HDMI, DisplayPort, PCI Express, and Serial ATA. However, modern semiconductor manufacturing processes usually have a much larger on-chip resistor variations, with a variation range of +/−20% to +/−35% being typical. As such, a calibration scheme is needed to provide accurate on-chip resistors. One result of low accuracy on-chip resistors is, for example, low product yield.

In the prior art, a conventional way to calibrate an on-chip resistor is to adjust a voltage controlled resistor which in CMOS is a PMOS or NMOS transistor. The control voltage is filtered by a low pass filter. In the prior art, an analog control voltage is used to continuously adjust the resistor value. This technique is discussed in "On-die Termination Resistors With Analog Impedance Control for Standard CMOS Technology," Yongpin Fan, Jeffery E. Smith, IEEE J. Solid-State Circuits, vol. 38, No. 2, February, 2003, and "A Mixed-Mode Voltage Down Converter with Impedance Adjustment Circuitry for Low-Voltage High-Frequency Memories," Tsukasa Oishi, et al., IEEE J. Solid-State Circuits, vol. 31, No. 4, April 1996.

However, these and other prior art expander systems have certain performance shortcomings. For example, analog memory in the form of a loop capacitor cannot be maintained at a fixed value without loop feedback because the capacitor leaks its stored charge. The capacitor charge must be updated by the control loop by detecting the resistor differences. The prior art systems require a relatively large die size, resulting in higher costs. Furthermore, delivering a control voltage to line termination line resistors is difficult and may introduce errors without very good buffering. Thus there is a need for improved on-chip resistor calibration systems and methods.

SUMMARY

Systems and method for on-chip resistor calibration are disclosed. A circuit for calibrating a resistance value on an integrated circuit includes a resistor network, a reference voltage generator, a comparator, a servo loop, and a shift register. The resistor network includes a plurality of resistor and switch pairs in parallel. The resistor network further includes a servo resistor in series with a servo resistor switch such that the servo resistor and servo resistor switch are in parallel with the plurality of resistor and switch pairs. The servo loop generates a shift register gating signal and includes a current sample register for storing a current comparator output data value and a previous sample register for storing a previous comparator output data value. The shift register, upon receipt of a shift register gating signal at a first state, inputs the current comparator output data value to shift data bits through the shift register. A data output of each flip flop of the shift register is coupled to and controls an associated controllable switch at the plurality of resistor and switch pairs.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1:
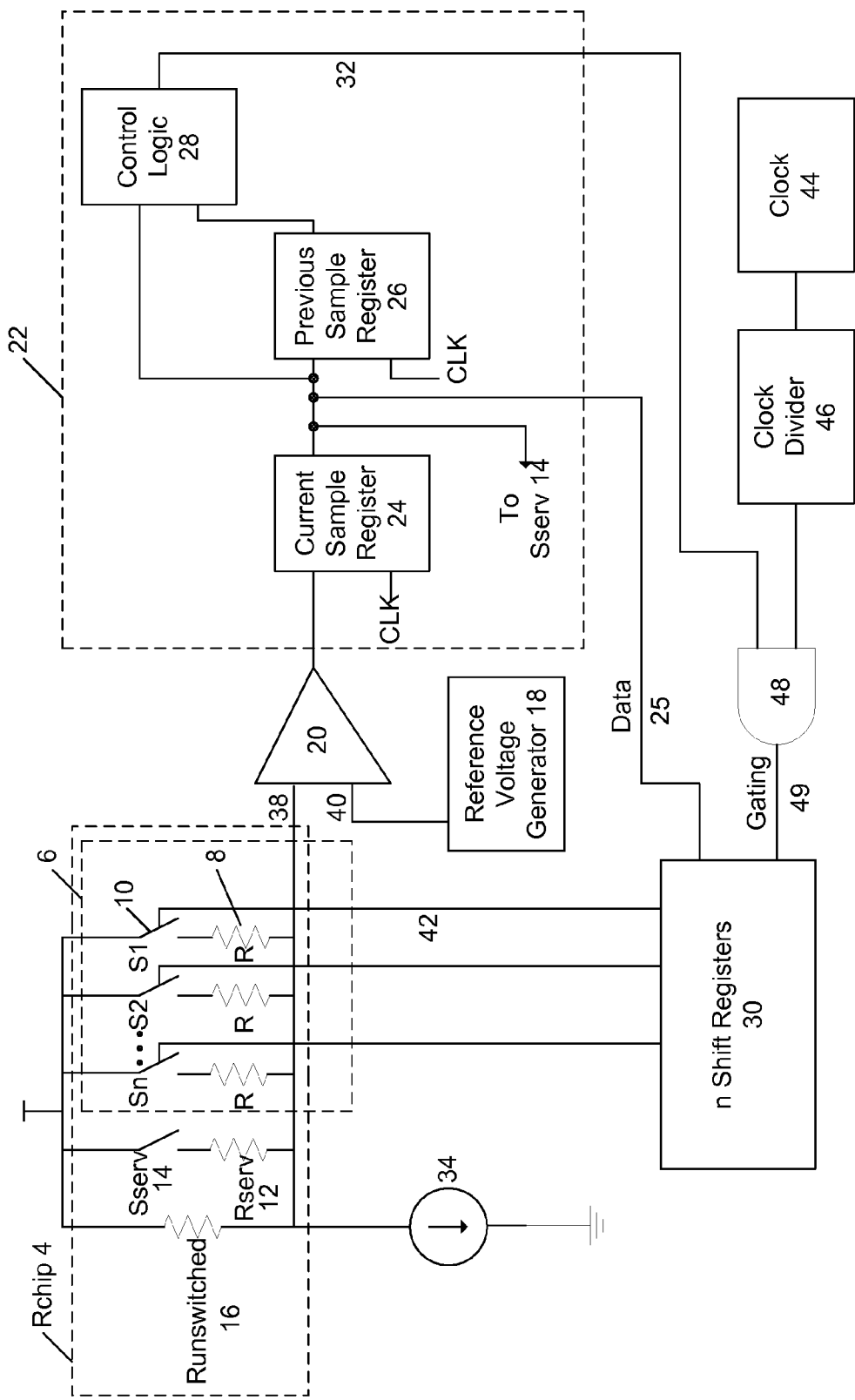
FIG. 1 illustrates a block diagram of an on-chip resistor calibration system in one example of the invention.

An on-chip resistor calibration system and method is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Particular circuit layouts and circuit components may be given for illustrative purposes. This is done for illustrative purposes to facilitate understanding only and one of ordinary skill in the art may vary the design and implementation parameters and still remain within the scope of the invention.

Generally this description relates to circuits that provide on-chip resistor calibration. Any semiconductor chip which requires on-chip resistor calibration can use the systems and methods described herein to precisely control the on-chip resistors. The on-chip resistor calibration system is suitable for use, for example, with applications requiring impedance calibration such as line termination of high speed signaling. Typical applications include, but are not limited to, serial data transmissions and high speed data transfer.

In one example, the system uses a digital circuit to calibrate the on-chip resistor. The system advantageously uses a network of parallel resistors with the total value of the network adjustable by adding or removing resistors using controllable switches. The state of each switch is controlled by and stored by a digital circuit such as a shift register. Thus, the value of the resistor network is indirectly stored by the shift register since the value of the resistors are known. Hysteresis is provided in determining whether the switch states should be modified. At steady-state, the calibrated resistor values are stored by the shift registers and can be stored without loss as long as the chip remains powered.

The system is advantageously used to provide an efficient way to calibrate the on chip resistor. Implementation is straightforward and hardware costs are low. The combination of the control switches with proper hysteresis avoids the use of expensive low pass components which are commonly used in prior art implementations. As described in further detail below, because the impedance to be measured is just a ratio replica resistor, die size and power are reduced and there is no impact on signals flowing through the actual in-use resistors on the chip remote from the calibration resistor network.

In one example of the invention, a circuit for calibrating a resistance value on an integrated circuit includes a resistor network, a reference voltage generator, a comparator, a servo loop, and a shift register. The resistor network includes a plurality of resistor and switch pairs in parallel, with each resistor and switch pair having a resistor and a controllable switch in series. The resistor network further includes a servo resistor in series with a servo resistor switch such that the servo resistor and servo resistor switch are in parallel with the plurality of resistor and switch pairs. The resistor network further includes a non-switched resistor in parallel with the servo resistor and the plurality of resistor and switch pairs. Current flowing through the resistor network produces a calibration voltage. The reference voltage generator produces a reference voltage, and the comparator compares the reference voltage with the calibration voltage.

The servo loop generates a shift register gating signal and includes a current sample register for storing a current comparator output data value and a previous sample register for storing a previous comparator output data value. A first control logic generates a preliminary gating signal responsive to the current comparator output data value and the previous comparator output data value. A second control logic generates the shift register gating signal responsive to the preliminary gating signal and a reference clock.

The shift register, upon receipt of a shift register gating signal at a first state, inputs the current comparator output data value to shift data bits through the shift register. The shift register includes a plurality of serially coupled flip-flops. A data output of each flip flop of the plurality of serially coupled flip-flops is coupled to and controls an associated controllable switch at the plurality of resistor and switch pairs. The current comparator output data value is output to and controls the servo resistor switch.

In one example of the invention, a method for calibrating a resistance value on an integrated circuit includes providing a resistor network. The resistor network includes a plurality of resistor and switch pairs in parallel. Each resistor and switch pair includes a resistor and a controllable switch in series. The resistor network further includes a servo resistor in series with a servo resistor switch. The servo resistor and the servo resistor switch are in parallel with the plurality of resistor and switch pairs. A non-switched resistor is in parallel with the servo resistor and the plurality of resistor and switch pairs. Current flowing through the resistor network produces a calibration voltage. The method includes comparing the calibration voltage with a reference voltage to produce a comparator output. A shift register gating signal is generated by storing a current comparator output data value and storing a previous comparator output data value.

The method includes generating a preliminary gating signal with a first control logic responsive to the current comparator output data value and the previous comparator output data value. The method further includes generating the shift register gating signal with a second control logic responsive to the preliminary gating signal and a reference clock. The shift register gating signal is input to a shift register, which upon receipt of the shift register gating signal at a first state inputs the current comparator output data value. The shift register includes a plurality of serially coupled flip-flops. A data output of each flip flop of the plurality of serially coupled flip-flops is coupled to and controls an associated controllable switch at the plurality of resistor and switch pairs. The method further includes outputting the current comparator output data value to the servo resistor switch.

Referring to FIG. 1, in an example of the invention an on-chip resistor calibration system 100 includes a ratio replica resistor network $R_{chip}$ 4 to be calibrated to a desired target value. Resistor network $R_{chip}$ 4 includes a plurality of resistor and switch pairs 6, servo resistor $R_{serv}$ 12, and non-switched resistor $R_{unswitched}$ 16 in parallel. Each resistor and switch pair is composed of a resistor R 8 and a controllable switch 10 in series. Controllable switch 10 may be any semiconductor device which has a conducting state and non-conducting state controllable by a logic signal. For example, controllable switch 10 is a CMOS switch. By adding and removing resistors, each controllable switch 10 allows the value of resistor network $R_{chip}$ 4 to be adjusted. The servo resistor $R_{serv}$ 12 is in series with a controllable servo resistor switch $S_{serv}$ 14.

A reference voltage generator 18 produces a reference voltage $V_{ref}$ 40. In one example of the invention, the reference voltage generator 18 is a silicon bandgap circuit implemented on the chip which can generate an accurate reference voltage $V_{ref}$ 40. A current source $I_{ref}$ 34 generates a current flowing through $R_{chip}$ 4. The reference current $I_{ref}$ 34 may be generated, for example, by applying the bandgap generated voltage $V_{ref}$ 40 to an external resistor $R_{ext}$. Since the $R_{ext}$ can be a precision resistor with high accuracy, an ideal current is generated as the reference current $I_{ref}$ 34. In operation, current form $I_{ref}$ 34 flowing through the resistor network ($R_{chip}$) 4 produces a calibration voltage $V_{cal}$ 38. A comparator 20 receives a its input $V_{cal}$ 38 and $V_{ref}$ 40 to measure the voltage difference between $V_{cal}$ 38 and $V_{ref}$ 40. The circuit is designed in the way that, when $R_{chip}$ 4 is on the design target, the $V_{cal}$ 38 equals to $V_{ref}$ 40.

The on-chip resistor calibration system 100 includes a feedback system such as servo loop 22 for dynamically adjusting the on-chip resistor $R_{chip}$ 4 value according to the comparator 20 output. In such a feedback system, n shift registers 30 are used as the memory to remember each switch 10 ON or OFF state, and thus the resistance of the plurality of resistor and switch pairs 6 value is memorized indirectly. The servo loop 22 components include a current sample register 24 which stores a current comparator output data value, a previous sample register 26 which stores a previous comparator output data value, and control logic 28 for generating a preliminary gating signal 32 responsive to the current comparator output data value and the previous comparator output data value. The input of current sample register 24 receives the output of comparator 20 upon receiving a clock signal. The output of current sample register 24 is tied to the input of previous sample register 26, the input of n Shift Registers 30, control logic 28, and servo resistor switch $S_{serv}$ 14.

The on-chip resistor calibration system 100 includes n shift registers 30 which receives at a clocking input an output gating signal 49 from an AND gate 48. The n shift registers 30 receive at a data input 25 the data output of current sample register 24. AND gate 48 has a first input from clock divider 46 and a second input from control logic 28. The plurality of serially coupled flip-flops forming the n shift registers 30 are clocked by an output signal obtained from a logic operation, such as AND gate 48 on the gating signal 32 and the output of clock divider 46. In one example, the n shift registers 30 are a plurality of serially coupled flip-flops. The number of flip flops in n shift registers 30 is equal to n, the number of switches 10 in the plurality of resistor and switch pairs 6. The data output of each flip flop of the plurality of serially coupled flip-flops is coupled to and provides an $R_{chip}$ switch control signal 42 to an associated controllable switch 10 at the plurality of resistor and switch pairs 6. A clock 44 outputs a clock signal input to current sample register 24 and previous sample register 26. The clock 44 also outputs a clock signal to a clock divider 46.

In one example of the invention, each resistor R 8 has the same weighted value so that the value of the plurality of resistor and switch pairs 6 is dependent on the total number of switches 10 open or closed regardless of the position/order of the switches within the plurality of resistor and switch pairs 6. The value of servo resistor $R_{serv}$ 12 is advantageously selected to be less than the value of resistor R 8 to allow steady state to be attained when $V_{cal}$ 38 is close, but not necessarily equal to $V_{ref}$ 40. The value of non-switched resistor $R_{unswitched}$ 16 is selected to be greater than a desired target value of $R_{chip}$ 4 to ensure the resistance value of $R_{chip}$ 4 can be set at the desired target value since the total $R_{chip}$ 4 value can never be greater than the lowest value resistor in the network of parallel resistors. However, one should note that the individual value of $R_{unswitched}$ 16 may be less than the individual value of resistor R 8. For example, in one illustrative example, the desired target value of $R_{chip}$ 4 is 50 ohms, a common value in termination resistor applications. The value of $R_{unswitched}$ 16 is selected to be 70 ohms, whereas the value of each switched resistor R 8 is selected to be 200 ohms. With all the switches 10 open, $R_{chip}$ 4 is at its largest value of 70 ohms. 200 ohm resistors are continually added until an $R_{chip}$ 4 target value of 50 ohms is reached. In a further example, $R_{unswitched}$ 16 is selected to be 65 ohms and the value of each switched resistor R 8 is selected to be 1000 ohms. One of ordinary skill in the art will recognize that a variety of resistor values and combinations may be selected to achieve a desired $R_{chip}$ 4 value.

In operation, the current $I_{ref}$ flowing through the resistor network ($R_{chip}$) 4 produces a current calibration voltage $V_{cal}$ 38 based on the resistance value of $R_{chip}$ 4. Comparator 20 compares the calibration voltage $V_{cal}$ 38 with the reference voltage $V_{ref}$ 40 to produce a comparator output which is stored at current sample register 24 at each clock cycle. At the next clock cycle, the comparator 20 outputs another comparator output dependent on the comparison of the current value of $V_{cal}$ 38 and $V_{ref}$ 40.

This current comparator output value is stored in current sample register 24 and the previous comparator output value stored is stored in previous sample register 26. The current comparator output value and previous comparator output value are input into the control logic 28 to output a shift register gating signal. In one example, the output of control logic 28 is high if both the current sample register 24 and previous sample register 26 store the same value.

The gating signal 32 is input to a logic operation such as AND gate 48. Upon receipt of a high gating signal 32 and a high clock signal from clock divider 46, AND gate 48 outputs a gating signal to n shift registers 30 to shift in data input 25. In one example, upon receipt of a high shift register gating signal the shift register inputs the current comparator output data value. Each data value in the shift register is shifted through the shift register, and the output of each flip flop in the shift register is output to an associated switch 10 at the plurality of resistor and switch pairs 6 to change the resistance of the plurality of resistor and switch pairs 6. If the shift register gating signal is low, no data input is made to n shift registers 30. In one example, the current comparator output data value is input to servo switch $S_{serv}$ 14 to add or remove servo resistor $R_{serv}$ 12 to $R_{chip}$ 4 at each clock cycle.

In one example, the calibration of $R_{chip}$ 204 is used to calibrate actual use resistors on the chip. Each actual use resistor is a switched resistor network. In other words, the resistor network $R_{chip}$ 204 is the ratio replica of the actual use resistors on the chip. For example, in a current mode logic (CML) buffer application, the actual use resistors may be termination resistors.

The switch control signals 42 (i.e. output of each register in n shift registers 30) are output to all actual use resistors via a switch bus. In this manner, the plurality of resistor and switch pairs 6 calibration is "matched" to the actual use resistors. This matching allows for many on-chip actual use resistors to be simultaneously calibrated. A calibration resistor network not in use by the circuit application is calibrated and the remaining actual use resistors are matched to the calibrated resistor value.

The matching does not require that the value of the resistor network $R_{chip}$ 4 be equal to the value of the actual use resistors. For example, a typical value of an actual use resistor in a termination application is 50 ohms. However, a 50 ohm resistor is more difficult to manufacture than a larger resistor value. As a result, the target value of $R_{chip}$ 4 may be advantageously designed to be a much higher, more easily manufacturable resistor value. For example, $R_{chip}$ 4 may have a target desired value of 500 ohms. Since the manufacturing process for a 500 ohm resistor has the same defects as the 50 ohm resistor, by calibrating $R_{chip}$ 4 to be 500 ohms, the value of the shift registers can be used to tune the matched actual use resistors since the ratio of inaccuracy is the same. The percentage variation of inaccuracy of a 500 ohm resistor is the same as that of a 50 ohm manufactured with the same process since the on-chip variation of the resistors is equivalent. For example, if the manufacturing process has 10 percent inaccuracy, the actual value of each resistor R 8 in the plurality of resistor and switch pairs 6 is equal to 450 Ohm and an actual use matched resistor is 45 ohms. By calibrating the plurality of resistor and switch pairs 6 to 500 ohms using the process described herein, the actual use resistor is calibrated to the desired value of 50 ohms. The proportional handling allows for matching.

Using a higher value of $R_{chip}$ 4 also advantageously decreases power consumption because the higher resistance value requires lower current to generate the same voltage drop across $R_{chip}$ 4. As a result, less heat is generated.

Figure 2:
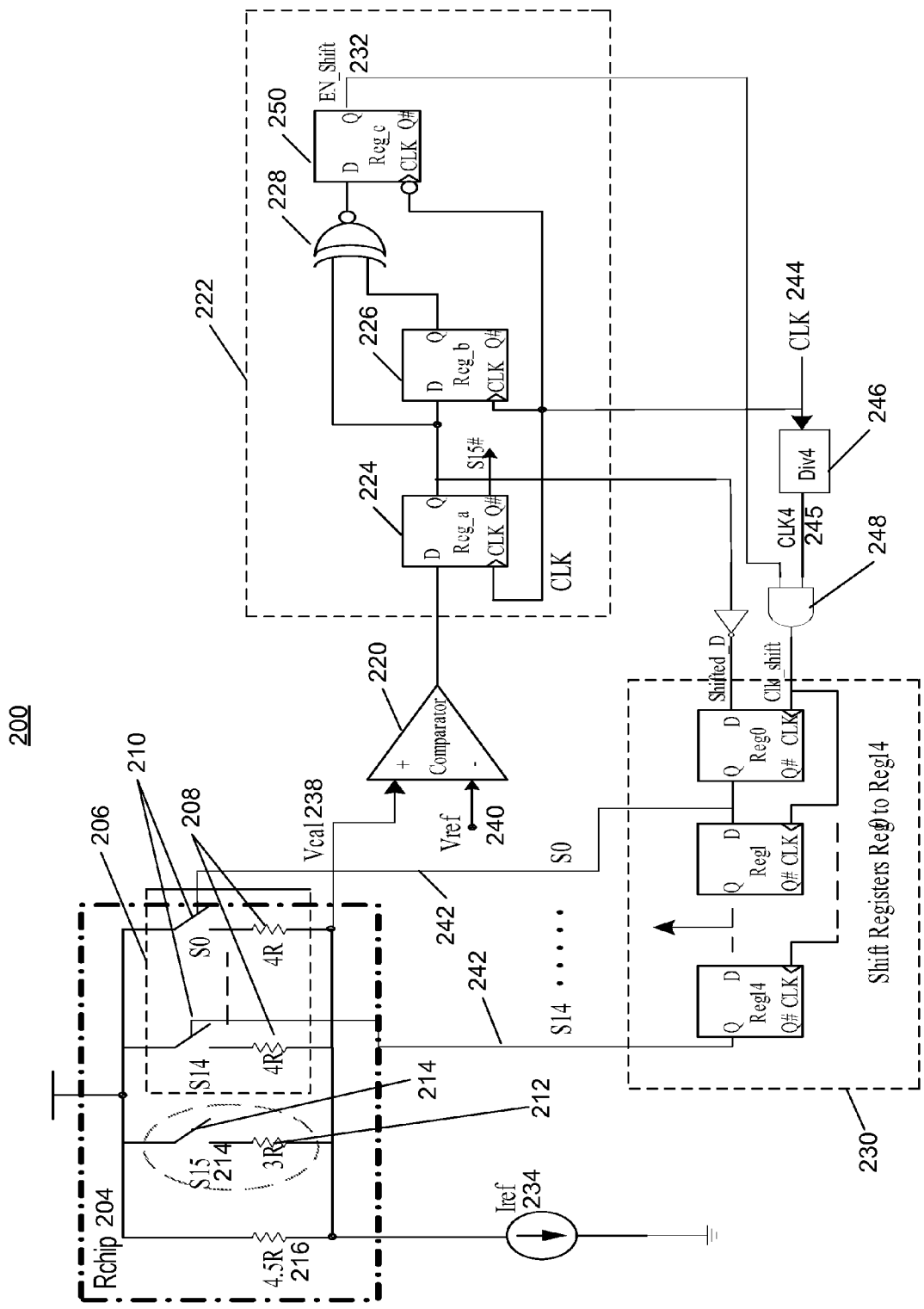
FIG. 2 illustrates a block diagram of a further example of an on-chip resistor calibration system.

The basic operation of on-chip resistor calibration system 100 can be considered on the basis of the block diagram illustration of FIG. 1. Achievement of some of the objectives of the invention can best be understood by consideration of the specific circuits of FIG. 2. Merely as an example, FIG. 2 illustrates a simplified diagram of an on-chip resistor calibration system 200 circuit which may be used to implement the block diagram of FIG. 1. A variety of components and component arrangements may be used to implement the functions set forth in FIG. 1.

Referring to FIG. 2, an example of an on-chip resistor calibration system 200 is shown. A resistor network $R_{chip}$ 204 includes a plurality of switched resistors 4R 208 and switches 210 forming a plurality of resistor and switch pairs 206. Each resistor 4R 208 is in series with an independently controllable switch 210. In the example shown in FIG. 2, there are 14 switched resistors 4R 208 and 14 corresponding switches 210 identified as S0 to S14. The resistor $R_{chip}$ 204 is a combination of 17 parallel resistors. One resistor has a fixed 4.5R value, 15 resistors have the 4R value, and the remaining one is 3R value. It is seen that 15 resistors are in fact switched resistors, switches S0 to S14 are controlled by the registers in a shift register 230.

The resistor network $R_{chip}$ 204 also includes a switched servo resistor 3R 212 in series with a servo switch S15 214. The switched servo resistor 3R 212 and servo switch S15 214 are in parallel with the plurality of resistor and switch pairs 206. The resistor network $R_{chip}$ 204 also includes a non-switched resistor 4.5R 216 in parallel with the plurality of resistor and switch pairs 206 and servo resistor 3R 212. The selection of resistors 4R 208, servo resistor 3R 212, and non-switched resistor 4.5R 216 are discussed in further detail below.

A current source $I_{ref}$ 234 generates a current flowing through $R_{chip}$ 204. In operation, current flowing through the resistor network ($R_{chip}$) 204 produces a calibration voltage $V_{cal}$ 238. A reference voltage generator produces a reference voltage $V_{ref}$ 240. A comparator 220 receives as its input $V_{cal}$ 238 and $V_{ref}$ 240 for comparison.

The on-chip resistor calibration system 200 includes a servo loop 222 for dynamically adjust the on-chip resistor values according to the measured result by the comparator. The servo loop 222 components include a Reg_a flip flop 224, Reg_b flip flop 226, XNOR gate 228, and Reg_c flip flop 250.

Each flip flop Reg_a flip flop 224, Reg_b flip flop 226, and Reg_c flip flop 250 has an input (D), a timing pulse signal input (CLK) for receiving a clock signal, an output (Q), and an inverted output (Q#). The input of Reg_a flip flop 224 receives the output of comparator 220 upon receiving a clock signal. The clock input for Reg_a flip flop 224, Reg_b flip flop 226, and XNOR gate 228 are all receive the timing signal from clock signal CLK 244. The output of Reg_a flip flop 224 is tied to the input of Reg_b flip flop 226, one of the inputs of XNOR gate 228, as well as the input to a shift register 230 as described in further detail below. The inverted output of Reg_a flip flop 224 is output to servo switch S15 214.

The output of Reg_b flip flop 226 is provided to the second input of XNOR gate 228. The output of XNOR gate 228 is input to Reg_c flip flop 250. The output of Reg_c flip flop 250 is input into one input of AND gate 248. The clock signal CLK 244 is output to a clock divider 246 whose output is input to the second input of AND gate 248. In the example shown in FIG. 2, clock divider 246 which divides the clock signal by a multiple of 4. The output of AND gate 248 is input to the timing signal input (CLK) of shift register 230.

Shift register 230 is a plurality of serially coupled flip-flops. The number of registers in shift register 230 is equal to the number of resistor and switch pairs in the plurality of resistor and switch pairs 206. In this example there are 15 registers identified as Reg0 to Reg14. Reg0 to Reg14 are the shift registers used to memorize the switch ON/OFF state. The data input (D) of each of the flip-flops in the shift register is connected to the output (A) of the preceding flip-flop. The data output (Q) of each flip flop of the plurality of serially coupled flip-flops is also output to a corresponding switch 210 at the plurality of resistor and switch pairs 206.

The 15 resistors 208 controlled by S0 to S14 have the same weighted value, the equivalent resistor value of this parallel combination of these 15 resistors depend on how many switches are ON and how many are OFF. In other words, the location of the ON switch is irrelevant as long as the number of ON switches is the same. The Reg0 to Reg14 store the ON/OFF states of the switches. If we use "1" to represent ON and "0" to represent OFF as conventional logic circuit notation, it can be stated that the total numbers of '1' or '0' determine the equivalent on-chip resistor value. It is noted that, adding more 1's or turning on more switches reduces the equivalent resistor value.

In one example, the current comparator output data value is input to switch S15 214 to add or remove servo resistor 3R 212 to $R_{chip}$ 204 at each clock cycle. The value of servo resistor 3R 212 is advantageously selected to be less than the value of resistor 4R 208 as described below. The value of resistor 4.5R 216 is selected to be greater than the desired target resistance value of $R_{chip}$ 204.

In operation, the current $I_{ref}$ 234 flowing through the resistor network ($R_{chip}$) 204 produces a current calibration voltage $V_{cal}$ 238 based on the resistance value of $R_{chip}$ 204. Comparator 220 is used here as a simple binary A/D converter. The output of the comparator 220 is sampled by a clock signal CLK 244. This clock signal CLK 244 and the derived clock signal CLK4 245 are the timing base for the resistor calibration. Clock divider 246 is a divide-by-4 functional block. At each clock cycle, the comparator 220 outputs another comparator output dependent on the comparison of the current value of $V_{cal}$ 238 and $V_{ref}$ 240. The comparator output is stored at Reg_a flip flop 224 at each clock cycle. The comparator output stored at Reg_a flip flop 224 in the previous clock cycle is input to and stored at Reg_b flip flop 226.

When $V_{cal}$ 238 is higher than $V_{ref}$ 240, comparator 220 gives a positive output denoted as logic "1", corresponding to a state where resistor $R_{chip}$ 204 is smaller than the desired target value. When $V_{cal}$ 238 is lower than $V_{ref}$ 240, comparator 220 gives an output denoted as logic "0", corresponding to a state where resistor $R_{chip}$ 204 is larger than the desired target value. Servo loop 222 acts to change the contents of shift register 230 only when the current clock cycle comparator output stored at Reg_a flip flop 224 and previous clock cycle comparator output stored at Reg_b flip flop 226 are either both one or both zero (referred to by the inventors as a "valid voice" state). In this state, the output of XNOR gate 228 is high and input to Reg_c flip flop 250, which outputs a high gating signal 232 to input the current comparator output at Reg_a flip flop 224.

The shift register 230 is shifted at the frequency of CLK4 245. The gating signal 232 is input to AND gate 248 along with CLK4 245. In one example, upon receipt of a high shift register gating signal the shift register inputs the current comparator output data value. Each data value in the shift register is shifted through the shift register, and the output of each flip flop in the shift register is output to an associated switch 210 at the plurality of resistor and switch pairs 206 to change the resistance of the plurality of resistor and switch pairs 206. If the shift register gating signal 232 is low, indicating that the comparator output stored at Reg_a flip flop 224 and Reg_b flip flop 226 are not either both one or both zero, no data input is made to n shift registers 30.

Thus, when both the output stored at Reg_a flip flop 224 and Reg_b flip flop 226 are "1", the servo loop 222 take actions to switch on one parallel resistor 4R 208 by shifting a "1" into the registers, and this "1" state will be held till a '0' is shifted out from the registers. The number of "1" in the shift registers is increased by one, which in turn decreases the equivalent resistor $R_{chip}$ 4 value. The process is repeated until the comparator 220 outputs a "0". The process is reversed where both the output stored at Reg_a flip flop 224 and Reg_b flip flop 226 are "0", in which case a "0" is shifted into the registers until the comparator 220 outputs a "1". Where the output of comparator 220 alternates between "1" and "0", no data is shifted into the shift registers.

Switch S15 214 and a servo resistor 3R 212 having a resistance value less than 4R are used to determine when steady state is achieved when $V_{cal}$ is close to $V_{ref}$. Switch S15 214 and servo resistor 3R 212 are utilized to determine whether calibration is complete so that the gating signal 232 is not enabled and no input is shifted into the shift register 230 when V$_{cal}$ 238 and V$_{ref}$ 240 are sufficiently close in value, but not necessarily exactly equal.

The state of S15 is used as the criterion to decide if the calibration is done. At every clock cycle, S15 is controlled by the output of Reg_a flip flop 224. Thus, the control of S15 is operated to change the value of R$_{chip}$ 204 by adding or removing servo resistor 3R 212. When steady state is reached, the inclusion of servo resistor 3R 212 when S15 is closed produces a R$_{chip}$ 204 resulting in a V$_{cal}$ 38 less than V$_{ref}$ 40, resulting in a comparator output of "0". At the next clock cycle, this "0" output from Reg_a flip flop 224 opens S15, thereby removing servo resistor 3R 212 from the circuit. This increases the value of R$_{chip}$ 204, producing a V$_{cal}$ 38 greater than V$_{ref}$ 40, resulting in a comparator output of "1". This process is repeated during steady state, with the output of comparator 220 alternating between "1" and "0". As discussed above, Reg_a flip flop 224 and Reg_b flip flop 226 store the previous and current states of S15. At steady state where the values of Reg_a flip flop 224 and Reg_b flip flop 226 are "0" and "1", the gating signal 232 never goes high and no additional data is shifted into shift register 230 as the value of the plurality of resistor and switch pairs 206 is fixed at the desired value. Upon reaching steady state, the value of S0 to S14 are transferred to the actual use resistors.

Two registers are used to hold the S15 previous and current states. The current state is also the comparator hysteresis control signal. The hysteresis level is advantageously selected to be larger than the least significant bit (LSB) to prevent boundary condition problems. For example, the hysteresis level is 1.5 LSB. When the calibration loop is locked around the steady state, the difference between V$_{cal}$ and V$_{ref}$ is small. When there's a 1 to 0 or 0 to 1 transition at the comparator 220 output, S15 toggles at the frequency of CLK. The toggling of the S15 will have impact on the value of R$_{chip}$. In this invention, in fact, S15 is not sent to control the real on-chip resistors, it is only used in the replica circuit to determine if the quantization level of 1.5 LSB is reached or not. Once the S15 toggling is detected, the gating signal 232 Shift_EN is pulled down, the clock to the shift registers is gated, and the shift registers keep the current state. The toggling S15 is kept internally and not sent to the true on-chip termination resistors. By recognizing the unavoidable quantization, in the real termination resistors, S15 is selected to be ON all the time. This helps to keep constant termination resistors once the calibration is done. In this manner, signaling on the termination resistors is not impacted. Thus, S15 is used as the hysteresis control signal and as the locking state indicator. The use of simple bubble-out shift registers simplifies the scheme, and provides a simple and efficient mechanism.

The value of servo resistor 3R 212 is advantageously selected to be less than the value of resistor 4R 208 to prevent boundary condition problems. Once steady state is reached, switch S15 214 is toggling on and off. By having the value of servo resistor 3R 212 selected to be less than the value of resistor 4R 208, the smaller value introduces larger variations in R$_{chip}$ 204 when it is switched in and out than if the servo resistor 3R 212 had the same value of resistor 4R 208, thus producing greater separation of V$_{cal}$ 238 from V$_{ref}$ 240 (either higher or lower than V$_{ref}$ 240) when switched in and out.

The on-chip resistor calibration system 200 provides an efficient way to calibrate on-chip resistors. No explicit low-pass filter, either analog or digital, is needed and by using the clocking flexibly, and by selectively assigning the 3R resistor value associated with switch S15, the on-chip resistor calibration system 200 successfully implements the general low-pass feature which is needed in almost all servo systems to stabilize adjustment movements.

Although example circuit configurations have been described in certain example of the invention, one of ordinary skill in the art will recognize that except as otherwise described herein other configurations and components may be used to perform similar functions. While the exemplary embodiments of the present invention are described and illustrated herein, it will be appreciated that they are merely illustrative and that modifications can be made to these embodiments without departing from the spirit and scope of the invention. Thus, the scope of the invention is intended to be defined only in terms of the following claims as may be amended, with each claim being expressly incorporated into this Description of Specific Embodiments as an embodiment of the invention.

What is claimed is:

1. A circuit for calibrating a resistance value on an integrated circuit comprising: a resistor network comprising:
    a plurality of resistor and switch pairs in parallel, wherein each resistor and switch pair comprises a resistor and a controllable switch in series;
    a servo resistor in series with a servo resistor switch, wherein the servo resistor and servo resistor switch are in parallel with the plurality of resistor and switch pairs; and
    a non-switched resistor in parallel with the servo resistor and the plurality of resistor and switch pairs, wherein current flowing through the resistor network produces a calibration voltage;
    a reference voltage generator for producing a reference voltage;
    a comparator for comparing the reference voltage with the calibration voltage; a servo loop for generating a shift register gating signal, the servo loop comprising:
    a current sample register for storing a current comparator output data value;
    a previous sample register for storing a previous comparator output data value;
    a first control logic for generating a preliminary gating signal responsive to the current comparator output data value and the previous comparator output data value;
    a second control logic for generating the shift register gating signal responsive to the preliminary gating signal and a reference clock;
    a shift register which upon receipt of a shift register gating signal at a first state inputs the current comparator output data value to shift data bits through the shift register, the shift register comprising a plurality of serially coupled flip-flops, wherein a data output of each flip flop of the plurality of serially coupled flip-flops is coupled to and controls an associated controllable switch at the plurality of resistor and switch pairs, and
    wherein the current comparator output data value is output to and controls the servo resistor switch.

2. The circuit of claim 1, wherein the first control logic comprises an XNOR gate.

3. The circuit of claim 1, wherein the second control logic comprises an AND gate.

4. The circuit of claim 1, wherein the servo resistor has a resistance value less than the resistance value of each resistor in the plurality of resistor and switch pairs.

5. The circuit of claim 1, where the data output of each flip flop of the plurality of serially coupled flip-flops is output to a matching resistor network.

6. The circuit of claim 1, wherein the current sample register comprises a first flip-flop and the previous sample register comprises a second flip-flop.

7. The circuit of claim 6, wherein the current sample register and the previous sample register are serially coupled and a data output of the current sample register is coupled to a data input of the previous sample register.

8. The circuit of claim 1, further comprising a gating signal register coupled to an output of the first control logic, wherein the gating signal register outputs the preliminary gating signal.

9. The circuit of claim 1, wherein each resistor in the plurality of resistor and switch pairs has a same weighted value.

10. The circuit of claim 1, wherein the non-switched resistor has a value selected to be greater than a resistor network target value.

11. A method for calibrating a resistance value on an integrated circuit comprising: providing a resistor network comprising:
a plurality of resistor and switch pairs in parallel, wherein each resistor and switch pair comprises a resistor and a controllable switch in series;
a servo resistor in series with a servo resistor switch, wherein the servo resistor and the servo resistor switch are in parallel with the plurality of resistor and switch pairs; and
a non-switched resistor in parallel with the servo resistor and the plurality of resistor and switch pairs, wherein current flowing through the resistor network produces a calibration voltage;
comparing the calibration voltage with a reference voltage to produce a comparator output;
generating a shift register gating signal comprising:
storing a current comparator output data value;
storing a previous comparator output data value;
generating a preliminary gating signal with a first control logic responsive to the current comparator output data value and the previous comparator output data value; and
generating the shift register gating signal with a second control logic responsive to the preliminary gating signal and a reference clock;
inputting the shift register gating signal to a shift register, wherein upon receipt of the shift register gating signal at a first state inputs the current comparator output data value, the shift register comprising a plurality of serially coupled flip-flops, wherein a data output of each flip flop of the plurality of serially coupled flip-flops is coupled to and controls an associated controllable switch at the plurality of resistor and switch pairs; and
outputting the current comparator output data value to the servo resistor switch.

12. The method of claim 11, wherein the first control logic comprises an XNOR gate.

13. The method of claim 11, wherein the second control logic comprises an AND gate.

14. The method of claim 11, wherein the servo resistor has a resistance value less than a resistance value of each resistor in the plurality of resistor and switch pairs.

15. The method of claim 11, where the data output of each flip flop of the plurality of serially coupled flip-flops is output to a matching resistor network.

16. The method of claim 11, wherein each resistor in the plurality of resistor and switch pairs has a same weighted value.

17. The method of claim 11, wherein the non-switched resistor has a value selected to be greater than a resistor network target value.

18. A circuit for calibrating a resistance value on an integrated circuit comprising: a resistor network comprising:
a plurality of resistor and switching means pairs in parallel, wherein each resistor and switching means pair comprises a resistor and a controllable switching means for switching a resistor in series;
a servo resistor in series with a servo resistor switching means for switching the servo resistor, wherein the servo resistor and the servo resistor switching means are in parallel with the plurality of resistor and switching means pairs; and
a non-switched resistor in parallel with the servo resistor and the plurality of resistor and switching means pairs, wherein current flowing through the resistor network produces a calibration voltage;
a reference voltage generator means for producing a reference voltage;
a comparator means for comparing the reference voltage with the calibration voltage;
a servo loop means for generating a shift register gating signal, the servo loop means comprising:
a current sample register means for storing a current comparator output data value;
a previous sample register means for storing a previous comparator output data value;
a first control logic means for generating a preliminary gating signal responsive to the current comparator output data value and the previous comparator output data value;
a second control logic means for generating the shift register gating signal responsive to the preliminary gating signal and a reference clock;
a shift register means for storing or modifying switch values which upon receipt of the shift register gating signal in a first state inputs the current comparator output data value, the shift register means comprising a plurality of registers, wherein a data output of each register is coupled to and controls an associated controllable switch at the plurality of resistor and switching means pairs, and wherein the current comparator output data value is output to and controls the servo resistor switching means.

19. The circuit of claim 18, wherein the servo resistor has a resistance value less than a resistance value of each resistor in the plurality of resistor and switching means pairs.

20. The circuit of claim 18, where the data output of each register of the shift register means is output to a matching resistor network.

21. The circuit of claim 18, wherein the current sample register means and the previous sample register means are serially coupled and a data output of the current sample register means is coupled to a data input of the previous sample register means.

22. The circuit of claim 18, further comprising a gating signal register means for outputting the preliminary gating signal coupled to an output of the first control logic means.

23. The circuit of claim 18, wherein each resistor in the plurality of resistor and switching means pairs has a same weighted value.

24. The circuit of claim 18, wherein the non-switched resistor has a value selected to be greater than a resistor network target value.

* * * * *

UNITED STATES PATENT AND TRADEMARK OFFICE
CERTIFICATE OF CORRECTION

PATENT NO.        : 7,382,153 B2
APPLICATION NO.   : 11/459880
DATED             : June 3, 2008
INVENTOR(S)       : Qing Ou-yang, Quan Yu and Ming Qu It is certified that error appears in the above-identified patent and that said Letters Patent is hereby corrected as shown below:

On the cover page, under Inventors item [75]:

Please replace the name of the first inventor "Quing Ou-yang" with --Qing Ou-yang--

Signed and Sealed this

Nineteenth Day of August, 2008

JON W. DUDAS
*Director of the United States Patent and Trademark Office*